United States Patent [19]

Sachs

[11] Patent Number: 4,684,825
[45] Date of Patent: Aug. 4, 1987

[54] 400 HZ AIRCRAFT GROUND POWER SUPPLY

[75] Inventor: Klaus Sachs, Osterode, Fed. Rep. of Germany

[73] Assignee: Anton Piller GmbH & Co. KG, Osterode, Fed. Rep. of Germany

[21] Appl. No.: 855,164

[22] Filed: Apr. 23, 1986

[30] Foreign Application Priority Data

Apr. 23, 1985 [DE] Fed. Rep. of Germany ....... 3514568
Feb. 25, 1986 [DE] Fed. Rep. of Germany ....... 3605937

[51] Int. Cl.[4] .......................... H02H 5/10; H01H 9/20
[52] U.S. Cl. .................................... 307/328; 307/113; 361/189
[58] Field of Search ............... 361/170, 189, 190, 268; 307/113, 115, 140, 328

[56] References Cited

U.S. PATENT DOCUMENTS 3,413,486 11/1968 Flieder et al. ..................... 361/189
4,008,403 2/1977 Rose ..................................... 307/113
4,044,208 8/1977 McDonald et al. ............. 200/51.09
4,163,134 7/1979 Budrose ............................. 200/157

FOREIGN PATENT DOCUMENTS 2111593 9/1972 Fed. Rep. of Germany.
2450454 11/1975 Fed. Rep. of Germany.

OTHER PUBLICATIONS

British Standard: Aerospace Series, G 219:1975, "Gen. Requirements for Ground Support Electrical Supplies," pp. 1-7 (BSI, London).
Euro-Standard 400 Hz-DFS 400, Part 1, 1982, "Specification for 400 Hz Aircraft Power Supply," pp. 1-20.
"A Proposed European Standard for 400 Hz Systems," G. Dettweiler et al., Airport Forum-No. 2/1983.

Primary Examiner—L. T. Hix
Assistant Examiner—David Porterfield
Attorney, Agent, or Firm—Gottlieb, Rackman & Reisman

[57] ABSTRACT

400 Hz aircraft ground power supply with a three phase AC power source connectable via an electric power relay and flexible cable provided with a socket connector to a plug connector at the aircraft. In the energizing circuit of the power relay is arranged a closing contact of a second electric relay, the energizing circuit of which is led via switching means at the socket connector to be actuated by a pin of the plug connector. Thus the closing contact of the second relay is opened as long as the socket connector is not plugged to the plug connector. A third electric relay energized via the connectors by a source of DC current on board the aircraft has a closing contact in parallel to the closing contact of the second relay in the energizing circuit of the power relay and further opening contacts disconnecting a separate source of voltage in the energizing circuit of the second relay if the third relay is energized.

9 Claims, 2 Drawing Figures

400 HZ AIRCRAFT GROUND POWER SUPPLY

FIELD OF THE INVENTION

The invention relates to a 400 Hz aircraft ground power supply to be connected via a flexible cable to a plug connector at the aircraft.

DESCRIPTION OF THE PRIOR ART

A 400 Hz aircraft ground power supply to which the invention is related is described in British Standard: Aerospace Series, G 219: 1975, and Euro-Standard DFS 400. In these known ground power supplies a 400 Hz three phase AC power source is connected via three main contacts of an electromagnetic power relay to a flexible cable. At the end of the cable a socket connector is provided which can be brought into engagement with a plug connector at the aircraft. At the aircraft a DC voltage source is provided which is connected on one side to an auxiliary pin and on the other side to a neutral conductor pin of the power supply at the plug connector. This DC voltage source is connected by the socket connector in series with a latching circuit of the power relay. If the socket connector is pulled off the plug connector, the latching circuit is automatically disrupted and thus the power relay becomes deenergized and thereby disconnects the power supply to the cable. The power relay is switched on by means of a push button control switch connecting its energizing circuit with a ground source of DC voltage. By means of this control switch, the energizing circuit of the power relay can be connected to the ground source of DC voltage even if the plug connector is not plugged in. Therefore the three phase contact sockets of the socket connector are powered each time the control switch is actuated, which may lead to dangerous situations.

It is an object of the invention to provide a 400 Hz aircraft ground power supply with which it will be impossible to energize the power relay if the socket connector is not in engagement with the plug connector at the aircraft.

SUMMARY OF THE INVENTION

According to the invention there is provided a second relay with a closing contact in the energizing circuit of the power relay in series with a second control switch, an energizing circuit for the second relay including a separate low voltage source and switching means in/on the socket connector actuated by a plug pin of the plug connector at the aircraft, said plug pin being independent of those plug pins connecting the three phases of the power supply so that the second relay is deenergized and its contact in the energizing circuit of the power relay opens if the socket connector is out of engagement with the plug connector at the aircraft and therefore the energizing circuit of the power relay is deenergized so that its three main contacts open and disconnect the AC power supply from the cable.

BRIEF DESCRIPTION OF THE DRAWINGS

The invention is by way of example illustrated in the drawing and is described hereafter in detail with the aid of the drawing in which.

DESCRIPTION OF THE PREFERRED EMBODIMENTS

Figure 1:
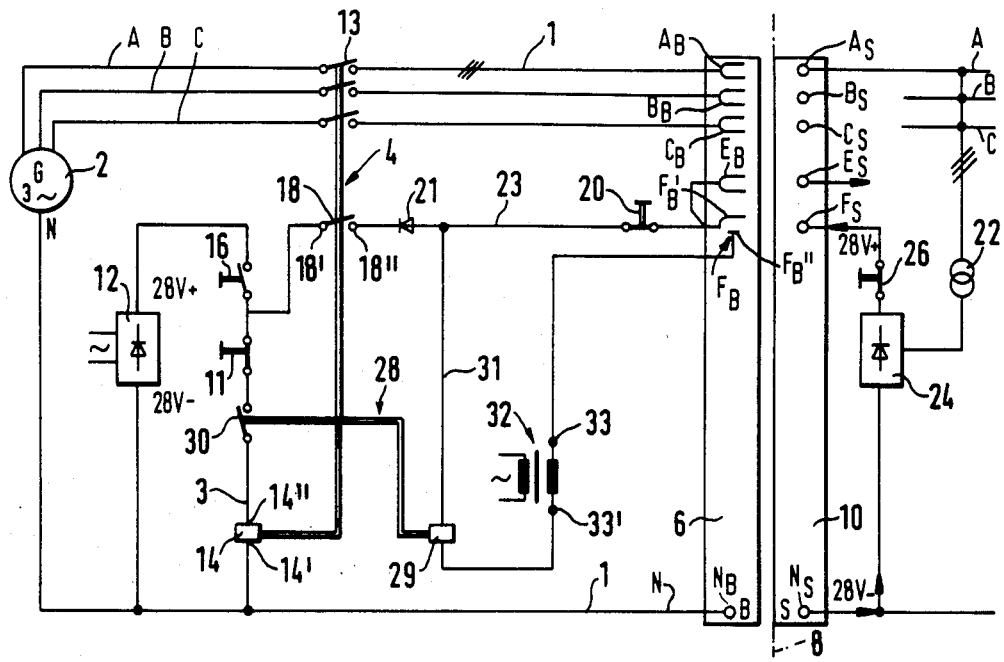
FIGS. 1 and 2 show a first and a second embodiment of the circuit of a 400 Hz aircraft ground power supply according to the invention.

The 400 Hz ground current supply as shown in FIG. 1 includes a three-phase AC current source 2 which can be a stationary or mobile generator driven by an electric motor or a combustion engine, but also an outlet of a 400 Hz power distribution net. The three phases A, B and C of the power supply are switchable by means of an electromagnetic power relay 4 having an energizing circuit 3 and are led together with the neutral conductor and several auxiliary conductors by means of a flexible cable 1 to a socket connector 6 provided at the end of the cable. The socket connector 6 is provided with sockets $A_B$, $B_B$, $C_B$, to which the phase conductors A, B and C are connected, sockets $E_B$, $F_B$, to which auxiliary conductors are connected, and a socket $N_B$, to which the neutral conductor N of the three-phase power source is connected. Fitted in the aircraft's wall indicated in the drawing by a dash-dotted line 8 is a plug connector 10 with the terminal pins $A_S$, $B_S$, $C_S$, $E_S$, $F_S$ and $N_S$, which correspond to the sockets $A_B$, $B_B$, $C_B$, $E_B$, $F_B$ and $N_B$ respectively. The socket connector 6 can be plugged into or onto the plug connector 10.

For the current supply of the energizing circuit 3 of the power relay 4 is provided a DC voltage source 12 on ground, which is here a source of 28 V DC voltage and which with its negative terminal is connected with the neutral conductor of the power source 2. With this neutral conductor is further connected one side 14' of the coil 14 of the power relay 4, of which the other side 14" is connected via a push button control switch 16 with a closing contact and normally also via a push button control switch 11 with an opening contact to the positive terminal of the DC voltage source 12.

Power relay 4 is provided, in addition to its main contacts 13 for the three power conductors A, B and C, with a latching contact 18, of which one terminal 18' is connected between the control switch 16 and the negative pole of the voltage source 12 into the energizing circuit 3 of the power relay 4. The other terminal 18" of the latching contact is connected via a blocking diode 21 and another control switch 20 having an opening contact to socket $F_B$ of socket connector 6.

On board the aircraft a three phase AC current transformer 22 is provided to the secondary side of which a rectifier 24 is connected establishing on board a source of 28 V DC voltage. One of the terminals, preferably the positive terminal, of this voltage source is connected via a push button control switch 26 having an opening contact to the plug pin $F_S$ of plug connector 10, whilst the other terminal is connected to the neutral conductor N of the three-phase AC current system on board with the three phase conductors A, B and C.

After plugging the socket connector 6 to the plug connector 10 a latching circuit 23 for the coil 14 of the power relay 4 is established which is in series with the source of DC voltage on board the aircraft. Thus it is safeguarded that power relay 4 will only stay in its switched-in position as long as the three phase AC voltage is supplied via the cable 1 to all three phases A, B and C of the AC power system on board.

The type of circuitry as described above is well known. It has the disadvantage that with socket 6 pulled off the plug 10, power relay 4 can be energized either purposely or inadvertently by actuating the control switch 16, whereby the voltage of three phase AC current source 2 appears at the sockets A, B and C of the socket connector 6 which is potentially dangerous even for life.

This is prevented in accordance with the present invention by a second electromagnetic relay 28 with a closing contact 30 and a coil 29. The contact 30 lies in series with the coil 14 in the energizing circuit 3 of the power relay 4. On energizing coil 29 the closing coil contact 30 in the energizing circuit 3 of the power relay 4 is closed. Therefore coil 14 can only be energized by actuating the control switch 16, if the second relay 28 has been energized before.

Coil 29 of the second relay 28 lies in series with a source 32 of low voltage, this source being by preference an AC transformer with an output voltage of e.g. 6 V. The secondary winding of the transformer 32 is connected with its terminal 33' via coil 29 of the second relay 28 and control switch 20 mounted on the socket connector 6 to socket $F_B$ partially using the conductor of the latching circuit 23. In/on socket $F_B$ are arranged switching means, which can be actuated by means of plug pin $F_S$.

In the embodiment shown socket $F_B$ is split lengthwise so that there are two electrically separated contact elements $F_B'$ and $F_B''$. Crosswise division is possible as well. Terminal 33 of transformer 32 is connected to contact element $F_B''$, whilst contact element $F_B'$ is connected to conductor 23 leading to terminal 18" of the latching contact 18 of power relay 4, and to the same conductor is also connected between control switch 20 and terminal 18" the coil 29 of the second relay 28. The thus-constituted energizing circuit 31 of the second relay 28 is closed by plug pin $F_S$ of plug connector 10 bridging the two contact elements $F_B'$ and $F_B''$ of the socket $F_B$ and thereby establishing the electrical connection between them. Therefore only after plugging socket connector 6 onto connector plug 10 is the energizing circuit of second relay 28 completed and only thereafter can power relay 4 be switched in by actuating control switch 16.

If socket connector 6 is pulled off plug connector 10, the energizing circuit 31 of the second relay 28 is opened. The second relay 28 becomes deenergized, thereby opening contact 30 in the energizing circuit 3 of power relay 4. Consequently power relay 4 can no longer be actuated by means of control switch 16 whereby the contacts 13 remain open. Hence, sockets $A_B$, $B_B$ and $C_B$ of the socket connector 6 can neither purposely nor inadvertently become connected to the power source 2 as long as the socket connector 6 is not plugged onto the plug connector 10 at the aircraft.

The above described safety circuit works automatically. No manual interferences can be made that would make ineffective the protection from unwanted or unauthorized actuation of power relay 4. In the cable 1 between the power relay 4 and the socket connector 6 only one additional auxiliary conductor to the contact element $F_B''$ in the socket connector 6 is required, which is normally included in the cables normally in use.

The embodiment with the split socket $F_B$ is easily realizable and is in practice insensitive both to soiling and ice formation. Other embodiments are also possible. For example, there can be provided an opening in the wall of socket $F_B$, in which is provided insulated against the socket a separate contact surface the latter being a second contact element in the energizing circuit 31 of the second relay 28. Further the socket can be split crosswise. The electrical connection is always established directly by the plug pin $F_S$. Alternatively, there exists a possibility to actuate over plug pin $F_S$ or any other plug pin a separate switch in/on the connector socket 6, in which case the actuating element for the switch should be electrically insulated. The actuating force can then be applied, for example radially or axially by the plug pin $F_S$. To said switch would be connected coil 29 in the energizing circuit 31 of the second relay 28 on the one hand and terminal 33 of the transformer 32 on the other hand.

With the known circuitry of the ground power supply described above the latching circuit of the power relay includes the source of DC voltage on board the aircraft. This has the disadvantage that the coil of the power relay may require a considerable power compared with the power capacity for which this source of DC voltage is normally designed.

Further, if for the low voltage source of current for the energizing circuit of the second electromagnetic relay an AC transformer is applied as the cheapest means of providing this source of current, then there will moreover exist the danger that with a breakdown of the transformer the potential of its primary winding reaches via its secondary winding and the plug connector the electrical installations at the aircraft, which may cause failures in the different electric installations on board.

Figure 2:
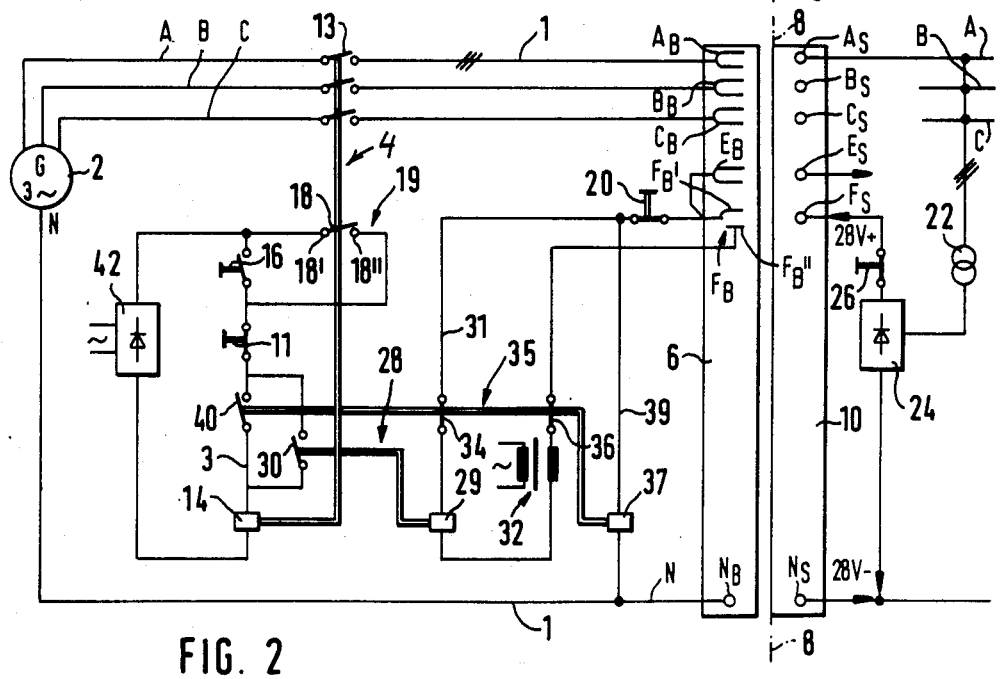

Both disadvantages are avoided with a circuit as shown in FIG. 2. In this drawing, corresponding elements are denoted with the same reference numbers as in FIG. 1. As far as this circuit corresponds to that of FIG. 1, reference should be had to the foregoing description.

For the power relay 4 with coil 14 there is included in the latching circuit of said relay as shown a source of voltage 42 which is electrically independent of the source of DC voltage on board the aircraft. Consequently also its output voltage is independent of the 28 V DC voltage of the source of DC voltage on board the aircraft. Thus for the energizing circuit of power relay 4 even different, preferably higher operating voltages can be chosen. Moreover, AC as well as DC voltage can be chosen at liberty. So far as the present embodiment is concerned, there is provided a DC voltage, but even an available mains AC voltage could be directly used. There can also be provided, however, the usual DC source of 28 V.

Latching circuit 19 of power relay 4 with its latching contact 18 is here connected in the usual manner in parallel to control switch 16 in the energizing circuit 3 of relay 4 which includes further—as in the case of the circuit of FIG. 1—the closing contact 30 of the second relay 28.

Energizing circuit 31 of the second relay with coil 29 and source 32 of low voltage, which circuit is here without any connection with latching circuit 3 of relay 4, is led—as is the case with the embodiment according to FIG. 1—over switching means in/on the socket connector and is closable or bridgeable by plug pin $F_S$ of plug connector 10 on the aircraft. As shown, neither for energizing circuit 3 nor for energizing circuit 31 is a connection required to the neutral conductor of the power source 2.

With the embodiment according to FIG. 2 is in addition provided a third relay 35, the energizing circuit 39 of which includes the coil 37, the neutral conductor N and that section of energizing circuit 31 of the second relay 28 in which is incorporated the control switch 20.

The energizing circuit 39 is closed via the corresponding sockets $F_B'$ and $N_B$ and pins $F_S$ and $N_S$ on the connectors 6 and 10 and the DC voltage source at the aircraft.

The third relay 35 is provided with three switching contacts. Of these, two contacts working as opening contacts 34, 36 are included in circuit 31 of the second relay 28 on both sides of the secondary winding of transformer 32. A third contact 40 working as closing contact is included in parallel to closing contact 30 of the second relay in the energizing circuit 3 of power relay 4.

If the socket connector is plugged into the plug connector at the aircraft, energizing circuit 31 of the second relay 28 is closed by plug pin $F_S$. As a result, contact 30 closes. By actuating control switch 16, energizing circuit 3 is connected to voltage source 42 and thus the power contacts 13 and the latching contact 18 of the power relay are closed. The source of DC voltage on board the aircraft energizes coil 37 of the third relay 35. Therewith its two opening contacts 34 and 36 are opened and simultaneously or just before that, the closing contact 40 is closed. By opening the contacts 34 and 36 the connections of the source 32 of low voltage are interrupted on both sides of said source and therewith any electric connection from this source to the aircraft. As a result, with the energizing circuit 31 of the second relay 28 opened the relay 28 falls off, whereby contact 30 opens. As closing contact 40 of the third relay 35 lying in parallel to contact 30 is closed, the energizing circuit of the power relay remains closed. The right switching sequence, namely the closing of contact 40 prior to the opening of contact 30 in energizing circuit 3 of the power relay, will normally be secured due to the usual sluggishness of the relays, but relay 28 can also be provided with an additional time delay, if necessary.

In the circuit according to FIG. 2 described above the DC source of voltage on board has only to deliver the current for energizing the coil 37 of the third relay 35. The coil of this relay having the function of an auxiliary relay has much smaller current capacity compared with the current capacity of coil 14 of the power relay 4. Therefore the source of DC voltage on board the aircraft is loaded to a lesser degree than is the case with the arrangement of FIG. 1.

The embodiment of FIG. 2 has in addition the advantage that it is without any alteration also applicable to aircraft with no source of DC voltage on board connected to pins of the plug connector as is for example the case with aircraft originating from Russia. If there is no such source of DC voltage available, after the plug connection with the aircraft has been made, the third relay 35 will stay deenergized. The plug pin F of the plug connector then only closes the energizing circuit 31 of the second relay 28. The danger of a potential escape into the aircraft in case of a breakdown of transformer 32 does not exist, since plug pin F has on board no connection with the electric system on board.

In the foregoing the contacts of the relays closing when the coil is being energized are referred to as closing contacts and those contacts opening thereby are referred to as opening contacts. The designations of the contacts for the push button control switches have been correspondingly chosen.

What I claim as my invention and desire to secure by Letters Patent of the United States is:

1. 400 Hz aircraft ground power supply comprising
   a three phase 400 Hz AC power source,
   a flexible cable connected at one side via three phase AC supply contactors to the power supply
   and at the other side to a socket connector connectable to a plug connector at the aircraft,
   an electromagnetic power relay including a latching contact and one contact for each of the three phase connectors of the cable,
   a ground voltage source to which the energizing circuit of the power relay is connectable by means of a first control switch with a closing contact in series with the coil of the power relay and the voltage source,
   a latching circuit including the latching contact of the power relay and a second control switch with an opening contact, arranged in series with the latching contact
   a second electromagnetic relay with a closing contact arranged in the energizing circuit of the power relay in series with the second control switch, and
   an energizing circuit for the second relay including a separate low voltage source and switching means in/on the socket connector and actuated by a plug pin of the plug connector at the aircraft, if the socket connector is in engagement with the plug connector at the aircraft,
   said plug pin being independent of those plug pins connecting the three phases of the power supply, so that the second relay is deenergized and its contact in the energizing circuit of the power relay opens if the socket connector is out of engagement with the plug connector at the aircraft and therefore the energizing circuit of the power relay is deenergized so that its three contactors open and disconnect the AC power supply from the cable.

2. Ground power supply according to claim 1 including a third electromagnetic relay provided with a closing contact connected parallel to the closing contact of the second relay in the energizing circuit of the power relay and further provided with contact means for disconnecting the low voltage source from the energizing circuit of the second relay if the third relay is not energized, the energizing circuit of the third relay including in series two sockets of the socket connector cooperating with two plug pins of the plug connector at the aircraft to which a DC voltage source at the aircraft is connected.

3. Ground power supply according to claim 2, in which the third relay includes two opening contacts in the energizing circuit of the second relay at both sides of the low voltage source for disconnecting said source from said energizing circuit.

4. Ground power supply according to claim 3, in which the low voltage ground power supply source is an AC transformer.

5. Ground power supply according to claim 2, in which the third relay includes two opening contacts in the mains at both sides of the primary winding of an AC transformer being used as the low voltage source, said opening contacts disconnecting said primary winding from the energizing circuit of the second relay if the third relay is energized.

6. Ground power supply according to claim 1, in which the socket cooperating with the independent plug pin has two contact elements insulated against each other in the socket connector, which elements are adapted to be bridged electrically conductive by the independent plug pin and which are connected in series with the separate low voltage source in the energized circuit of the second relay.

7. Ground power supply according to claim 6 in which the socket in longitudinal direction is divided into two contact elements which are insulated against each other.

8. Ground power supply according to claim 1 or 2, in which the latching circuit of the power relay includes in series with the switching means in/on the socket connector the DC voltage source at the aircraft, the pin and socket connection at the aircraft for the neutral conductor of the ground power supply in the cable and the coil of the energizing circuit of the power relay directly connected to said neutral conductor.

9. Ground power supply according to claim 1 in which in/at the socket connector is provided a separate switch connected in series in the energizing circuit of the second relay, said switch being actuated by one of the plug pins of the plug connector at the aircraft.

* * * * *